United States Patent [19]
Schwindt

[11] Patent Number: 6,075,376
[45] Date of Patent: *Jun. 13, 2000

[54] LOW-CURRENT PROBE CARD

[76] Inventor: Randy J. Schwindt, 2940 SE. Tacoma, Portland, Oreg. 97202

[*] Notice: This patent is subject to a terminal disclaimer.

[21] Appl. No.: 09/290,380

[22] Filed: Apr. 12, 1999

Related U.S. Application Data

[63] Continuation of application No. 08/988,243, Dec. 1, 1997.
[51] Int. Cl.⁷ ................................................... G01R 1/06
[52] U.S. Cl. ................................. 324/762; 324/754
[58] Field of Search .................... 324/754, 762, 324/755, 758, 760, 765; 439/482, 824; 174/68.1, 72 R, 36, 102 SC, 102 R, 103, 107; 333/240, 248, 247

[56] References Cited

U.S. PATENT DOCUMENTS

| | | | |
|---|---|---|---|
| 4,161,692 | 7/1979 | Tarzwell | 324/158 P |
| 4,195,259 | 3/1980 | Reid et al. | 324/158 |
| 4,267,507 | 5/1981 | Guerpont | 324/158 P |
| 4,382,228 | 5/1983 | Evans | 324/158 |
| 4,593,243 | 6/1986 | Lao et al. | 324/158 P |
| 4,626,775 | 12/1986 | Cho et al. | 324/73 R |
| 4,678,865 | 7/1987 | Sherwin | 174/36 |
| 4,731,577 | 3/1988 | Logan | 324/158 F |
| 5,214,243 | 5/1993 | Johnson | 174/36 |
| 5,610,529 | 3/1997 | Schwindt | 324/760 |
| 5,729,150 | 3/1998 | Schwindt | 324/762 |

OTHER PUBLICATIONS

"Low–Level Measurements" catalog printed Jun. 1984 (3d. ed.) by Keithley Instruments, Inc. Cleveland, Ohio, pp. 1–37.
"Suhner HF–Kabel/RF Cables," catalog by Huber & Suhner AG, Herisau, Switzerland, p H1, printed prior to Nov. 1995.
"Special Audio, Communication and Instrumentation Cables–Low Triboelectric Noise Coaxial Cables," (one page) by Belden Wire & Cable printed prior to Nov. 1995.
"CeramiCard 4800 Series," promotional material (2 pages) by IBM, Hopewell Junction, N.Y., printed May 1995.
"CeramiCard 700X and 880X Series," promotional material (2 pages) by IBM, Hopewell Junction, N.Y. printed May 1995.
"CeramiCard Connection," newsletter (2 pages) vol. 2. No. 1, Spring/Summer 95 by IBM, East–Fishkill, N.Y.
"CeramiCard 9601 Series," promotional material (2 pages), by IBM, Hopewell Junction, N.Y., printed May 1995.
"CeramiCard 6401 Series," promotional material (2 pages), by IBM, Hopewell Junction, N.Y., printed May 1995.

*Primary Examiner*—Vinh P. Nguyen
*Attorney, Agent, or Firm*—Kevin L. Russell

[57] ABSTRACT

A low-current probe card for measuring currents down to the femtoamp region includes a dielectric board, such as of glass-epoxy material, forming an opening. A plurality of probing devices, such as ceramic blades, are edge-mounted about the opening so that the probing elements or needles included thereon terminate below the opening in a pattern suitable for probing a test device. A plurality of cables are attached to the card for respectively connecting each device to a corresponding channel of a test instrument. The on-board portion of each cable is of coaxial type and includes an inner layer between the inner dielectric and outer conductor for suppressing the triboelectric effect. An inner conductive area and a conductive backplane that are respectively located below and on one side of each device are set to guard potential via the outer conductor of the corresponding cable so as to guard the signal path on the other side of the device. The lead-in portion of each cable, which is detachably connected to the corresponding on-board portion through a plug-in type connector, is of triaxial type and includes, besides the inner layer between the inner dielectric and outer conductor, a second inner dielectric and second outer conductor. A conductive cover and an outer conductive area that substantially enclose the components on the card are set to shield potential via the second outer conductor and connector.

35 Claims, 2 Drawing Sheets

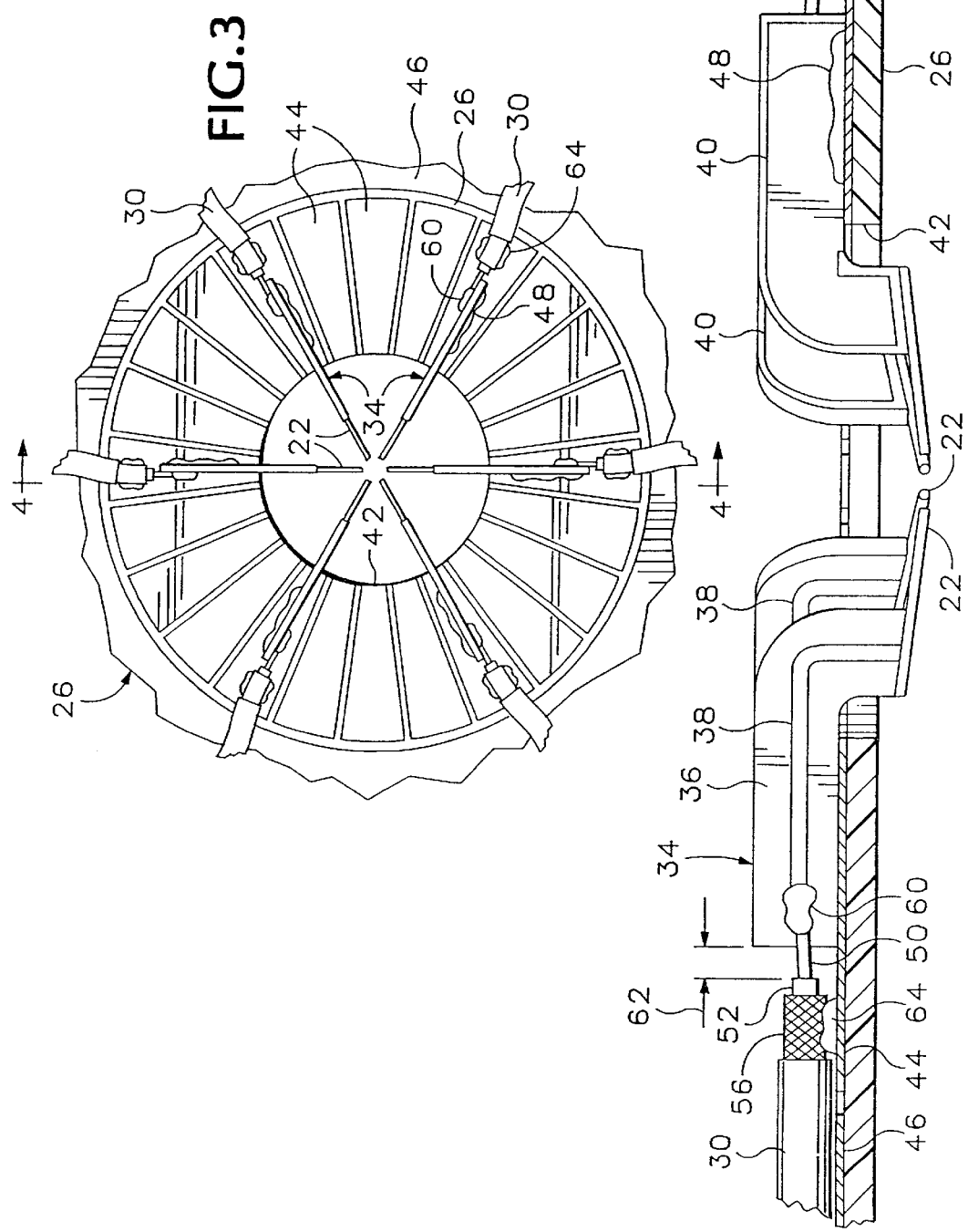

LOW-CURRENT PROBE CARD

This is a continuation of U.S. patent application Ser. No. 08/988,243 filed Dec. 1, 1997.

BACKGROUND OF THE INVENTION

The present invention relates to probe cards which are used for probing test devices, such as integrated circuits on a wafer, and, in particular, relates to probe cards that are suitable for use in measuring ultra-low currents.

Typically, in the construction of a probe card, a dielectric board is used as a base. A plurality of probing devices are mounted in radial arrangement about an opening in the board so that the probing elements of these devices, which may, for example, comprise slender conductive needles, terminate below the opening in a pattern suitable for probing the contact sites of the test device. The probing devices are individually connected to the respective channels of a test instrument by a plurality of interconnecting lines, where the portion of each line that extends between the corresponding probing device and the outer edge of the dielectric board may comprise an interconnecting cable or a conductive trace pattern formed directly on the board. In one conventional type of setup where the test devices are integrated circuits formed on a semiconductive wafer, the probe card is mounted by means of a supporting rig or test head above the wafer, and a support beneath the wafer moves the wafer so that each device thereon is consecutively brought into contact with the needles or probing elements of the probe card.

With particular regard to probe cards that are specially adapted for use in measuring ultra-low currents (down to the femtoamp region or lower), probe card designers have been concerned with developing techniques for eliminating or at least reducing the effects of leakage currents, which are unwanted currents that can flow into a particular cable or channel from surrounding cables or channels so as to distort the current measured in that particular cable or channel. For a given potential difference between two spaced apart conductors, the amount of leakage current that will flow between them will vary depending upon the volume resistivity of the insulating material that separates the conductors, that is, if a relatively lower-resistance insulator is used, this will result in a relatively higher leakage current. Thus, a designer of low-current probe cards will normally avoid the use of rubber-insulated single-core wires on a glass-epoxy board since rubber and glass-epoxy materials are known to be relatively low-resistance insulators through which relatively large leakage currents can flow.

One technique that has been used for suppressing inter-channel leakage currents is surrounding the inner core of each lead-in wire with a cylindrical "guard" conductor, which conductor is maintained at the same potential as the inner core by a feedback circuit in the output channel of the test instrument. Because the voltage potentials of the outer guard conductor and the inner conductive core are made to substantially track each other, negligible leakage current will flow across the inner dielectric that separates these conductors regardless of whether the inner dielectric is made of a low- or high-resistivity material. Although leakage current can still flow between the guard conductors of the respective cables, this is typically not a problem because these guard conductors, unlike the inner conductive cores, are at low impedance. By using this guarding technique, significant improvement may be realized in the low-level current measuring capability of certain probe card designs.

To further improve low-current measurement capability, probe cards have been constructed so as to minimize leakage currents between the individual probing devices which mount the probing needles or other elements. With respect to these devices, higher-resistance insulating materials have been substituted for lower-resistance materials and additional conductive surfaces have been arranged about each device in order to perform a guarding function in relation thereto. In one type of assembly, for example, each probing device is constructed using a thin blade of ceramic material, which is a material known to have a relatively high volume resistivity. An elongate conductive trace is provided on one side of the blade to form the signal line and a backplane conductive surface is provided on the other side of the blade for guarding purposes. The probing element of this device is formed by a slender conductive needle, such as of tungsten, which extends in a cantilevered manner away from the signal trace. Such devices are commercially available, for example, from Cerprobe Corporation based in Tempe, Ariz. During assembly of the probe card, the ceramic blades are edge-mounted in radial arrangement about the opening in the card so that the needles terminate within the opening in a pattern suitable for probing the test device. The conductive backplane on each blade is connected to the guard conductor of the corresponding cable and also to corresponding conductive pad or "land" adjacent the opening in the probe card. In this manner each conductive path is guarded by the backplane conductor on the opposite side of the blade and by the conductive land beneath it.

It has been found, however, that even with the use of guarded cables and ceramic probing devices of the type just described, the level of undesired background current is still not sufficiently reduced as to match the capabilities of the latest generation of commercially available test instruments, which instruments are able to monitor currents down to one femtoamp or less. Thus, it was evident that other changes in probe card design were needed in order to keep pace with the technology of test instrument design.

In the latest generation of probe cards, efforts have been directed toward systematically eliminating low-resistance leakage paths within the probe card and toward designing extensive and elaborate guarding structures to surround the conductors along the signal path. For example, in one newer design, the entire glass-epoxy main board is replaced with a board of ceramic material, which material, as noted above, presents a relatively high resistance to leakage currents. In this same design, the lead-in wires are replaced by conductive signal traces formed directly on the main board, which traces extend from an outer edge of the main board to respective conductive pads that surround the board opening. Each pad, in turn, is connected to the signal path of a corresponding ceramic blade. In addition, a pair of guard traces are formed on either side of each signal trace so as to further isolate each trace against leakage currents.

In yet another of these newer designs, a main board of ceramic material is used having three-active layers to provide three dimensional guarding. Above this main board and connected thereto is a four-quadrant interface board that includes further guard structures. Between these two board assemblies is a third unit including a "pogo carousel." This pogo carousel uses pogo pins to form a plurality of signal lines that interconnect the interface board and the lower main board. It will be recognized that in respect to these pogo pins, the effort to replace lower resistance insulators with higher resistance insulators has been taken to its practical limit, that is, the insulator that would normally surround the inner conductor has been removed altogether.

The probe card designs which have just been described represent the current state-of-the-art. From the foregoing examples, it will be seen that a basic concern in the art has been the suppression of inter-channel leakage currents. Using these newer designs, it is possible to measure currents down to nearly the femtoamp level. However, the ceramic material used in these newer designs is relatively more expensive than the glass-epoxy material it replaces. Another problem with ceramic materials is that they are relatively susceptible to the absorption of surface contaminants such as can be deposited by the skin during handling of the probe card. These contaminants can decrease the surface resistivity of the ceramic material to a sufficient extent as to produce a substantial increase in leakage current levels. In addition, the more extensive and elaborate guarding structures that are used in these newer designs has contributed to a large increase in design and assembly costs. Based on these developments it may be anticipated that only gradual improvements in the low-current measurement capability of the cards is likely to come about, which improvements, for example, will result from increasingly more elaborate guarding systems or from further research in the area of high resistance insulative materials.

It should also be noted that there are other factors unrelated to design that can influence whether or not the potential of a particular probe card for measuring low-level currents will be fully realized. For example, unless special care is taken in assembling the probe card, it is possible for surface contaminants, such as oils and salts from the skin or residues left by solder flux, to contaminate the surface of the card and to degrade its performance (due to their ionic character, such contaminants can produce undesirable electrochemical effects). Furthermore, even assuming that the card is designed and assembled properly, the card may not be suitably connected to the test instrument or the instrument may not be properly calibrated so as to completely null out, for example, the effects of voltage and current offsets. In addition, the probe card or the interconnecting lines can serve as pickup sites for ac fields, which ac fields can be rectified by the input circuit of the test instrument so as to cause errors in the indicated dc values. Thus, it is necessary to employ proper shielding procedures in respect to the probe card, the interconnecting lines and the test instrument in order to shield out these field disturbances. Due to these factors, when a new probe card design is being tested, it can be extremely difficult to isolate the causes of undesirable background current in the new design due to the numerous and possibly interacting factors that may be responsible.

In view of the foregoing, what is needed is a probe card that is capable of being used for the measurement of ultra-low level currents but yet can be inexpensively manufactured from relatively low-cost materials in accordance with a relatively straightforward assembly process.

SUMMARY OF THE INVENTION

In accordance with the present invention, the inventor has discovered that the primary problem, at least at some stage in the design, is not how best to suppress the leakage currents that flow between the different signal channels but rather how best to suppress those currents that internally arise in each cable or signal channel as a result of the triboelectric effect. In a guarded cable, triboelectric currents can arise between the guard conductor and the inner dielectric due to friction therebetween which causes free electrons to rub off the conductor and creates a charge imbalance that causes current to flow. Once the inventor recognized that this triboelectric effect might be the critical problem, he proceeded to test this insight by substituting "low-noise" cables for the guarded cables that had heretofore been used. These low-noise cables, which were custom-made in order to meet size constraints, made a significant difference to the low current measurement capability of the probe card. Indeed, even though these cables were used in connection with a relatively inexpensive glass-epoxy board, and even though, under conventional thinking, this type of material did not possess sufficiently high resistance to permit ultra-low current measurements, the inventor was able to achieve current measurements down to the femtoamp region. Within weeks of this discovery, the commercial value of this invention became readily apparent when measurement data taken from a prototype of the subject probe card was instrumental to a customer purchase order for two probing stations worth hundreds of thousands of dollars apiece.

It will be noted that the inventor does not claim to have discovered a new solution to the problem of the triboelectric effect. A relatively straightforward solution to this problem can be found in the field of cable technology wherein it is known how to construct a "low-noise" cable by using an additional layer of material between the outer conductor and the inner dielectric, which material is of suitable composition for suppressing the triboelectric effect. This layer, in particular, includes a nonmetallic portion that is physically compatible with the inner dielectric so as to be prevented from rubbing excessively against this dielectric and, on the other hand, includes a portion that is sufficiently conductive that it will immediately dissipate any charge imbalance that may be created by free electrons that have rubbed off the outer conductor. It is not claimed by the inventor that this particular solution to the triboelectric effect problem is his invention. Rather it is the recognition that this specific problem is a major source of performance degradation in the field of low-current probe card design that the inventor regards as his discovery.

In retrospect, one can speculate as to why the significance of the triboelectric effect was not recognized sooner by investigators in the art of probe card design. One possible reason is that verifying the importance of this effect is not merely a matter of replacing guarded cables with low-noise cables. As indicated, in the Background section hereinabove, traces formed directly on the main dielectric board have largely replaced guarded cables in the newer generation of probe card designs, so that in order to begin with a design where this problem is amendable to a straightforward solution, one must return to an older and presumably less effective technology. Moreover, because of the non-design related factors specified in the Background section, one of ordinary skill who assembled and then tested a probe card that included low-noise cables would not necessarily detect the superior capability of this probe card for low current measurements. For example, surface contaminants deposited on the probe card during its assembly might raise the background level of current to a sufficient extent that the effect of the low-noise cables is concealed. To this it may be added that the direction taken in the art of probe card design, where the focus has been on the problem of suppressing inter-channel leakage currents, has provided solutions which, by happenstance, have also substantially resolved the triboelectric effect problem. These solutions, which included replacing cables with trace-like conductors on ceramic boards or using signal lines in which no insulator at all surrounds the signal conductor (as in the case of signal lines formed by pogo pins) are complicated and expensive compared to the inventor's relatively straightforward solution to the triboelectric effect problem. However, the indirect and mitigating effect of these alternative solutions, which served to conceal the problem, does help to explain why a more direct solution to the triboelectric effect problem was overlooked even by sophisticated designers of state-of-the-art probe cards.

In accordance, then, with the present invention, a probe card is provided for use in measuring ultra-low currents, which probe card includes a dielectric board, a plurality of probing devices that are edge-mounted in radial arrangement about an opening in the board, and a plurality of cables for connecting each probing device to a corresponding channel of a test instrument. These cables are of suitable construction to be used in a guarded mode, that is, they include an outer conductor that surrounds the inner conductor or core of the cable, which outer conductor can be used as a guard conductor in relation to the inner conductor. Furthermore, these cables include an inner layer of material between the outer conductor and the underlying inner dielectric, which layer is of suitable composition for reducing triboelectric current generation between the inner dielectric and the outer conductor to less than that which would occur were the inner dielectric and the outer conductor to directly adjoin each other.

In accordance with the foregoing construction, a probe card is provided in which a significant source of background current is suppressed in a relatively straightforward manner thereby eliminating the need for providing complicated and expensive structures to suppress other less significant sources in order to achieve the capability of measuring ultra-low currents. This and other objectives, features and advantages of the invention will be more readily understood upon consideration of the following detailed description of the invention taken in conjunction with the accompanying drawings.

BRIEF DESCRIPTION OF THE DRAWINGS

FIG. 3 is a broken-away plan view of the low-current probe card of FIG. 1 in the region surrounding the opening in the card, in which view the cover has been removed to show the underlying elements.

FIG. 4 is a sectional view taken along lines 4—4 in FIG. 3.

DETAILED DESCRIPTION OF THE PREFERRED EMBODIMENT

Figure 1:
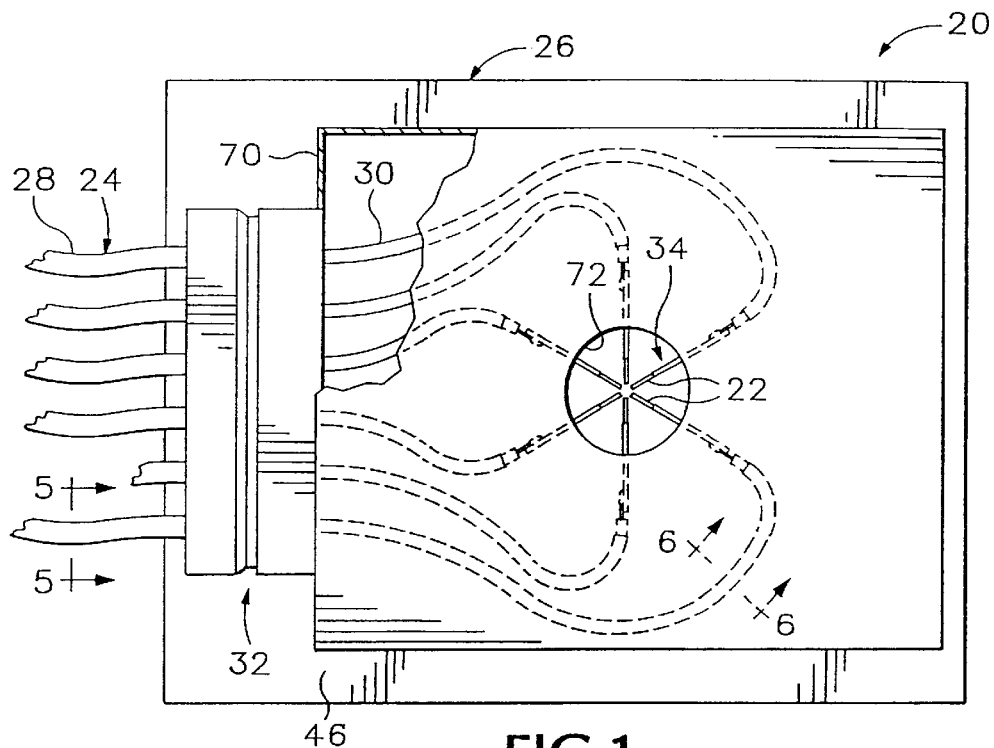
FIG. 1 is a plan view of a low-current probe card constructed in accordance with the present invention where a portion of a conductive cover included on the card has been broken away to reveal elements hidden thereunder.
Figure 2:
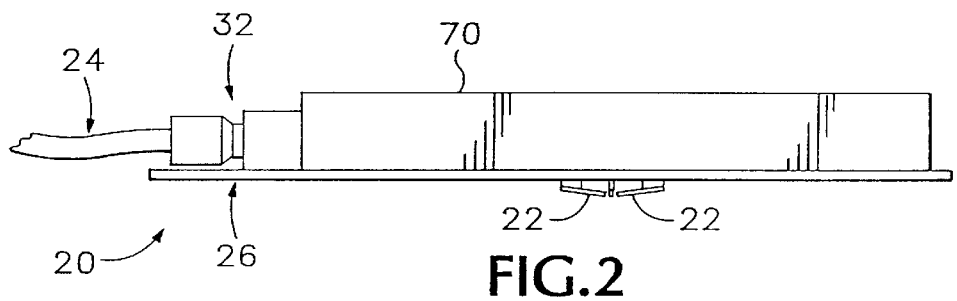
FIG. 2 is a side elevational view of the low-current probe card of FIG. 1.

FIG. 1 shows an exemplary low-current probe card 20 constructed in accordance with the present invention. Referring also to FIGS. 2 and 4, this card includes a plurality of probing elements 22. In the preferred embodiment shown, these probing elements comprise tungsten needles which extend in generally radial arrangement so that their tips terminate in a pattern suitable for probing the contact sites on a test device (not shown). For example, if the device to be tested is an individual circuit on a semiconductive wafer having a square-like arrangement of contacts sites, the needles would correspondingly terminate in a square-like pattern. Further included on the probe card are a plurality of cables 24. During use of the probe card, each of these cables is connected to a separate channel of a test instrument (not shown) thereby electrically connecting each channel to a corresponding one of the probing elements. It will be recognized that although only six cables and probing elements are shown in the drawings, this small number was selected for ease of illustration only. Actually, twenty-four cables and probing elements are included with the probe card shown in the drawings, although an even greater number than this can be provided as explained hereinbelow.

The exemplary probe card 20 includes a dielectric board 26 which, in the preferred embodiment shown, is made of FR4 glass-epoxy material. This board generally serves as the base of the probe card on which the other card components are mounted. As shown in FIG. 1, each cable includes a lead-in portion 28 and an onboard portion 30, which respective portions are detachably connected together by means of a plug-in type connector 32, thereby facilitating the separate testing of the lead-in portions of the cables. As further described hereinbelow, these cables include conductive and dielectric layers in coaxial arrangement with each other and further include at least one layer of material within each cable adapted for suppressing the triboelectric effect so as to minimize any undesirable currents that would otherwise be generated internally in each cable due to this effect. This layer of material together with certain other structures included on the probe card enable the card to be used for the measurement of ultra-low currents down to one femtoamp or less. In comparison to a design which uses conductive traces on a ceramic board, not only is the present design less expensive to make, it also is less susceptible to surface contaminants and can, for example, continue to operate in a satisfactory manner in low-temperature test environments where moisture can condense on the main board.

Referring to FIGS. 3 and 4, the on-board portion 30 of each cable is electrically connected to one end of a probing device 34, where the other end of this device includes the probing element or needle 22. With respect to the exemplary probe card 20 shown, each probing device includes a dielectric substrate 36 preferably formed of ceramic or a comparable high-resistance insulating material. This ceramic substrate or "blade" has a pair of broad parallel sides interconnected by a thin edge. Formed on one side of each blade is an elongate conductive path 38 while the other side includes a backplane conductive surface 40. A lower conductor (not shown) is formed along a bottom portion of each edge, which conductor electrically connects to the corresponding elongate conductive path 38. In turn, each probing element or needle 22 is electrically connected to a respective one of these conductors so that the element or needle extends in a cantilevered fashion beyond the corresponding substrate 36 as shown in FIG. 4. In the particular embodiment shown, the substrate or blade 36 is generally L-shaped in profile and is edge-mounted on the dielectric board 26 so that the short arm of each L-shaped blade extends through an opening 42 in the board thereby allowing the needles to terminate below the opening. As indicated above, blades having a construction of the type just described are commercially available from Cerprobe Corporation of Tempe, Ariz.

Referring to FIG. 3, a plurality of inner conductive areas 44 are formed on the dielectric board 26 about the opening 42 in circumferentially spaced relationship to each other. Also formed on the board is an outer conductive area 46 which surrounds the inner conductive areas in spaced relationship thereto. This outer conductive area extends outwardly to the four edges of the board. As shown in FIGS. 3–4, a solder connection 48 electrically connects the backplane conductive surface 40 of each ceramic blade 36 to a corresponding one of the inner conductive areas 44 so that the ceramic blades are edge-mounted in radial arrangement about the opening 42. The ceramic blades are now prepared for connection with the on-board portions 30 of the cables as will now be described.

Figures 5, 6:
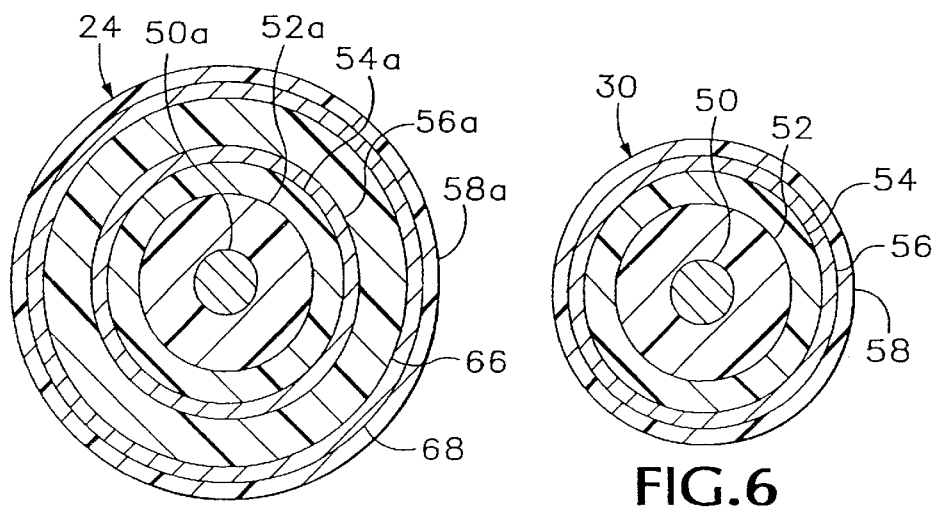
FIG. 5 is a cross sectional view of the lead-in portion of a particular one of the cables as taken along lines 5—5 in FIG. 1.
FIG. 6 is a cross sectional view of the onboard portion of a particular one of the cables as taken along lines 6—6 in FIG. 1.

FIG. 6 shows a transverse sectional view through the on-board portion 30 of one of the cables 24 as taken along lines 6—6 in FIG. 1. This portion, which is of coaxial construction, includes an inner conductor or core 50, an inner dielectric 52, an inner layer 54, an outer conductor 56 and an insulative jacket 58. The inner layer 54 is of suitable composition for reducing triboelectric current generation between the inner dielectric and the outer conductor to less than that which would occur were the inner dielectric and the outer conductor to directly adjoin each other. As indicated in the Summary section hereinabove, this inner layer 54 should have physical properties similar to that of the inner dielectric 52 so that it does not rub excessively against the inner dielectric despite cable flexing or temperature changes. At the same time, this inner layer should have sufficient conductive properties to dissipate any charge imbalances that may arise due to any free electrons that have rubbed off the outer conductor. A suitable material for this purpose is a fluoropolymer such as TEFLON™ or other insulative material such as polyvinylchloride or polyethylene in combination with graphite or other sufficiently conductive additive.

In the field of radio frequency (rf) cable technology, cables that include a layer of the type just described are generally referred to as "low-noise" cables. Commercial sources for this type of cable include Belden Wire and Cable Company based in Richmond, Ind. and Suhner HF-Kabel based in Herisau, Switzerland. With regard to the preferred embodiment depicted, the cable which was used was purchased from Times Microwave Systems based in Wallingford, Conn. In order to provide the desired twenty-four channel capability, these cables were custom ordered so that their diameter did not exceed that of standard RG178 cable.

It should be noted that some care must be exercised while connecting the on-board portion 30 of each cable to the corresponding probing device 34 in order to prevent defects that would substantially degrade the low-current measuring capability of the probe card. Referring to FIGS. 3–4, a solder connection 60 connects the inner conductor 50 of each cable to the rear end of the elongate conductive path 38 of the corresponding probing device 34. Before making this connection, it is desirable to position the cable so that the conductive and dielectric layers in the cable that surround the inner core 50 are set back a certain distance 62 away from the rear edge of the probing device 34. This reduces the possibility that a fine strand of hair or other contaminant will form a low-resistance or conductive bridge so as to cause a low-resistance shunt or short across the signal line. Also, in making this connection, it is important not to overheat the cable so as not to impair the structural properties of the material which forms the inner dielectric 52, which material can comprise, for example, air-expanded TEFLON™ for maximum temperature stability. Finally, after the connection has been made, all solder flux residue that remains should be removed from the board in order to prevent undesired electrochemical effects and to maintain the surface resistivity of the glass-epoxy board 26 at a reasonable level.

In order to further reduce the possibility of undesirable shunting connections, the outer conductor or metallic braid 56 of the cable is connected indirectly to the backplane conductive surface 40 through the corresponding inner conductive area 44, that is, a solder connection 64 electrically connects the metallic braid to the inner conductive area and a second solder connection 48 electrically connects the inner conductive area to the backplane conductive surface 40. Again, care must be taken not to overheat the cable or to leave solder flux residue on the circuit board. During use of the probe card, the signal variation or voltage is transmitted along the card by means of the inner conductor 50, the elongate conductive path 38 and the probing element 22. Preferably, the test equipment is connected so that a feedback circuit in the output channel of the test equipment supplies a "guard" voltage that matches the instantaneous signal voltage, which guard voltage is applied to the outer conductor 56 and to the corresponding inner conductive area 44. In this manner, then, each elongate conductive path is guarded by the backplane conductive surface 40 on the opposite side of the blade 36 and by the corresponding inner conductive area 44 which is arranged below the path. By minimizing leakage currents into and out of each elongate path, this guarding system reduces the levels of undesired background current and so enhances the effect achieved in respect to the cables due to the suppression of the triboelectric effect.

Another potential source of current disturbance can arise due to ac fields in the external environment surrounding the probe card. One conventional solution to this problem is to place the test instrument, interconnecting cables and probe card all together in a "wire cage" in order to shield these components against ac pickup.

With respect to the exemplary probe card 20, the problem of ac pickup is addressed in a more straight-forward fashion. FIG. 5 shows a transverse cross sectional view of the lead-in portion 28 of a particular one of the cables 24 as taken along lines 5—5 in FIG. 1. In similarity with the on-board portion 30 of the cable as shown in FIG. 6, the lead-in portion includes an inner conductor or core 50a, an inner dielectric 52a, an inner layer 54a, an outer conductor 56a and an insulative jacket 58a. However, the lead-in portion of the cable further includes a second inner dielectric 66 and a second outer conductor 68. In effect, the lead-in portion of the cable is a triaxial cable of "low-noise" type where the second outer conductor can be so connected as to serve as a shield conductor for self-shielding of the lead-in portions of the cables.

The second outer or shield conductor 68 is electrically connected to the outer conductive area 46 of the dielectric board 26 through the plug-in type connector 32, which connector has a metallized outer surface suitable for making such connection. The outer conductive area 46 is electrically connected, in turn, to a conductive cover 70. When the second outer conductor is set to the shielding potential by the test instrument, which potential is typically at ground, not only the lead-in portions of the cables but also the on-board probe card components are substantially shielded against ac fields. In particular, the outer conductive area 46 and the conductive cover 70 form a self-contained and compact shielding box that substantially surrounds and shields the probe card components that are mounted on the dielectric board. Formed into the top of the conductive cover is a viewing aperture 72 into which the viewing tube of a microscope can be inserted to facilitate viewing of the probing elements or needles 22 as they are being positioned on the contact sites of the device under test.

It will be recognized that alternative forms of the invention are possible without departing from the broader principles of the present invention. For example, if it is desired to handle a greater number of channels with the probe card, it is possible to modify the probe card to accept a greater number of cables by using a cable connector in which the cables are mounted along two ranks instead of just one. Other design variations will be evident to those of ordinary skill in the art.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe card for probing a test device comprising:
   (a) a dielectric board forming an opening;
   (b) a plurality of probing devices for probing a corresponding plurality of probing sites on said test device, each probing device including a dielectric substrate having first and second sides, an elongate conductive path on said first side and an elongate probing element connected to one end of said elongate conductive path so as to extend in a cantilevered manner beyond said substrate, said probing devices being edge-mounted in radial arrangement about said opening so that said probing elements terminate below said opening in a pattern suitable for probing said sites;
   (c) a plurality of cables for connecting each probing device to a corresponding channel of a test instrument, each cable including an inner conductor, an inner dielectric and an outer conductor, each inner conductor being electrically connected to a corresponding one of said conductive paths, and
   (d) a conductive cover positioned over said dielectric board, wherein said dielectric board includes an outer conductive area surrounding a plurality of inner conductive areas in spaced relationship thereto, and said cover includes a lower edge along which said cover is connected electrically to said outer conductive area.

2. The probe card of claim 1 wherein each probing device includes a conductive surface on said second side, each outer conductor is electrically connected to a corresponding one of said conductive surfaces, and said probing devices are arranged so that said conductive surfaces alternate with said conductive paths in a circumferential sequence.

3. The probe card of claim 2 wherein said dielectric board includes a plurality of inner conductive areas surrounding said opening in circumferentially spaced relationship to each other, and each conductive surface is electrically connected to a corresponding one of said inner conductive areas.

4. The probe card of claim 1 wherein each cable includes a lead-in portion leading to said board, said lead-in portion including a shielding conductor surrounding said outer conductor in radially spaced relationship thereto, said shielding conductors being connected electrically to said cover.

5. The probe card of claim 4 further including a cable connector through which said cables pass directly into a shielded enclosure formed by said cover, said cable connector providing an electrical connection path interconnecting said shielding conductors and said cover.

6. The probe card of claim 1 wherein said dielectric board includes a plurality of inner conductive areas surrounding said opening in circumferentially spaced relationship to each other, each probing device being mounted so that each elongate conductive path is positioned above a corresponding one of said inner conductive areas, each outer conductor being directly connected to a corresponding one of said inner conductive areas.

7. The probe card of claim 1 wherein said dielectric board is principally composed of glass-epoxy material.

8. A probe card for probing a test device comprising:
   (a) a dielectric board forming an opening;
   (b) a plurality of probing devices for probing a corresponding plurality of probing sites on said test device, each probing device including a dielectric substrate having first and second sides, an elongate conductive path on said first side and an elongate probing element connected to one end of said elongate conductive path so as to extend in a cantilevered manner beyond said substrate, said probing devices being edge-mounted in radial arrangement about said opening so that said probing elements terminate below said opening in a pattern suitable for probing said sites;
   (c) a plurality of cables for connecting each probing device to a corresponding channel of a test instrument, each cable including an inner conductor, an inner dielectric and an outer conductor, each inner conductor being electrically connected to a corresponding one of said conductive paths, and
   (d) a conductive cover positioned over said dielectric board, wherein each cable includes a lead-in portion leading to said board, said lead-in portion including a shielding conductor surrounding said outer conductor in radially spaced relationship thereto, said shielding conductors being connected electrically to said cover.

9. The probe card of claim 8 wherein each probing device includes a conductive surface on said second side, each outer conductor is electrically connected to a corresponding one of said conductive surfaces, and said probing devices are arranged so that said conductive surfaces alternate with said conductive paths in a circumferential sequence.

10. The probe card of claim 9 wherein said dielectric board includes a plurality of inner conductive areas surrounding said opening in circumferentially spaced relationship to each other, and each conductive surface is electrically connected to a corresponding one of said inner conductive areas.

11. The probe card of claim 8 wherein said dielectric board includes an outer conductive area surrounding a plurality of inner conductive areas in spaced relationship thereto, and said cover includes a lower edge along which said cover is connected electrically to said outer conductive area.

12. The probe card of claim 8 further including a cable connector through which said cables pass directly into a shielded enclosure formed by said cover, said cable connector providing an electrical connection path interconnecting said shielding conductors and said cover.

13. The probe card of claim 8 wherein said dielectric board includes a plurality of inner conductive areas surrounding said opening in circumferentially spaced relationship to each other, each probing device being mounted so that each elongate conductive path is positioned above a corresponding one of said inner conductive areas, each outer conductive being directly connected to a corresponding one of said inner conductive areas.

14. The probe card of claim 8 wherein said dielectric board is principally composed of glass-epoxy material.

15. A probe card for probing a test device comprising:
   (a) a dielectric board forming an opening;
   (b) a plurality of probing devices for probing a corresponding plurality of probing sites on said test device, each probing device including a dielectric substrate having first and second sides, an elongate conductive path on said first side and an elongate probing element connected to one end of said elongate conductive path so as to extend in a cantilevered manner beyond said substrate, said probing devices being edge-mounted in radial arrangement about said opening so that said probing elements terminate below said opening in a pattern suitable for probing said sites;

(c) a plurality of cables for connecting each probing device to a corresponding channel of a test instrument, each cable including an inner conductor, an inner dielectric and an outer conductor, each inner conductor being electrically connected to a corresponding one of said conductive paths, and (d) a conductive cover positioned over said dielectric board, wherein said dielectric board includes a plurality of inner conductive areas surrounding said opening in a circumferentially spaced relationship to each other, each probing device being mounted so that each elongate conductive path is positioned above a corresponding one of said inner conductive areas, each outer conductor being directly connected to a corresponding one of said inner conductive areas.

16. The probe card of claim 15 wherein each probing device includes a conductive surface on said second side, each outer conductor is electrically connected to a corresponding one of said conductive surfaces, and said probing devices are arranged so that said conductive surfaces alternate with said conductive paths in a circumferential sequence.

17. The probe card of claim 16 wherein said dielectric board includes a plurality of inner conductive areas surrounding said opening in circumferentially spaced relationship to each other, and each conductive surface is electrically connected to a corresponding one of said inner conductive areas.

18. The probe card of claim 15 wherein said dielectric board includes an outer conductive area surrounding a plurality of inner conductive areas in spaced relationship thereto, and said cover includes a lower edge along which said cover is connected electrically to said outer conductive area.

19. The probe card of claim 15 wherein each cable includes a lead-in portion leading to said board, said lead-in portion including a shielding conductor surrounding said outer conductor in radially spaced relationship thereto, said shielding conductors being connected electrically to said cover.

20. The probe card of claim 19 further including a cable connector through which said cables pass directly into a shielded enclosure formed by said cover, said cable connector providing an electrical connection path interconnecting said shielding conductors and said cover.

21. The probe card of claim 15 wherein said dielectric board is principally composed of glass-epoxy material.

22. A probe card for probing a test device comprising:

(a) a dielectric board forming an opening;

(b) a plurality of probing devices for probing a corresponding plurality of probing sites on said test device, each probing device including a dielectric substrate having first and second sides, an elongate conductive path on said first side and an elongate probing element connected to one end of said elongate conductive path so as to extend in a cantilevered manner beyond said substrate, said probing devices being edge-mounted in radial arrangement about said opening so that said probing elements terminate below said opening in a pattern suitable for probing said sites;

(c) a plurality of cables for connecting each probing device to a corresponding channel of a test instrument, each cable including an inner conductor, an inner dielectric and an outer conductor, each inner conductor being electrically connected to a corresponding one of said conductive paths, and (d) a conductive cover positioned over said dielectric board.

23. The probe card of claim 22 wherein each probing device includes a conductive surface on said second side, each outer conductor is electrically connected to a corresponding one of said conductive surfaces, and said probing devices are arranged so that said conductive surfaces alternate with said conductive paths in a circumferential sequence.

24. The probe card of claim 23 wherein said dielectric board includes a plurality of inner conductive areas surrounding said opening in circumferentially spaced relationship to each other, and each conductive surface is electrically connected to a corresponding one of said inner conductive areas.

25. The probe card of claim 22 wherein said dielectric board includes an outer conductive area surrounding a plurality of inner conductive areas in spaced relationship thereto, and said cover includes a lower edge along which said cover is connected electrically to said outer conductive area.

26. The probe card of claim 22 wherein each cable includes a lead-in portion leading to said board, said lead-in portion including a shielding conductor surrounding said outer conductor in radially spaced relationship thereto, said shielding conductors being connected electrically to said cover.

27. The probe card of claim 26 further including a cable connector through which said cables pass directly into a shielded enclosure formed by said cover, said cable connector providing an electrical connection path interconnecting said shielding conductors and said cover.

28. The probe card of claim 22 wherein said dielectric board includes a plurality of inner conductive areas surrounding said opening in circumferentially spaced relationship to each other, each probing device being mounted so that each elongate conductive path is positioned above a corresponding one of said inner conductive areas, each outer conductor being directly connected to a corresponding one of said inner conductive areas.

29. The probe card of claim 22 wherein said dielectric board is principally composed of glass-epoxy material.

30. A probe card for probing a test device comprising:

(a) a dielectric board forming an opening;

(b) a probing device for probing a corresponding probing site on said test device, said probing device including a probing element, said probing device being mounted proximate said opening so that said probing element terminates below said opening for probing said site; and (c) a cable connecting said probing device to a test instrument, said cable including an inner conductor and an outer conductor, said inner conductor being electrically connected to said probing element, each cable further including a layer of material between said inner conductor and said outer conductor and said outer conductor of suitable composition for reducing triboelectric current generation of said cable to less than that which would occur were said layer of material not included.

31. The probe card of claim 30 wherein said dielectric board includes an inner conductive area surrounding said opening and a conductive surface on said probing device is electrically connected to said inner conductive area.

32. The probe card of claim 30 further including a conductive cover positioned over said dielectric board.

33. The probe card of claim 32 wherein said dielectric board includes an outer conductive area, and said cover includes an edge along which said cover is connected electrically to said outer conductive area thereby enclosing said probing device.

34. The probe card of claim 32 wherein said cable includes a lead-in portion leading to said board, said lead-in portion including a shielding conductor surrounding said outer conductor in radially spaced relationship thereto, said shielding conductor being connected electrically to said cover.

35. The probe card of claim 34 further including a cable connector through which said cable passes directly into a shielded enclosure formed by said cover, said cable connector providing an electrical connection path interconnecting said shielding conductor and said cover.

* * * * *

UNITED STATES PATENT AND TRADEMARK OFFICE
CERTIFICATE OF CORRECTION

PATENT NO.    : 6,075,376
DATED         : June 13, 2000
INVENTOR(S)   : Randy J. Schwindt It is certified that error appears in the above-identified patent and that said Letters Patent is hereby corrected as shown below:

<u>Title page,</u>
Item [63], Related U.S. Application Data, please delete "Continuation of application No. 08/988,243, Dec. 1, 1997, and insert therefor -- Continuation of application No. 08/988,243, Dec. 1, 1997, which is a continuation of application No. 08/566,137, filed on December 1, 1995, now U.S. Pat. No. 5,729,150. --

Signed and Sealed this

Nineteenth Day of August, 2003

JAMES E. ROGAN
*Director of the United States Patent and Trademark Office*